United States Patent
Wack et al.

(10) Patent No.: US 8,842,272 B2
(45) Date of Patent: Sep. 23, 2014

(54) APPARATUS FOR EUV IMAGING AND METHODS OF USING SAME

(75) Inventors: Daniel C. Wack, Fredericksburg, VA (US); Damon F. Kvamme, Los Gatos, CA (US); John R. Rogers, Monrovia, CA (US); James P. McGuire, Jr., Pasadena, CA (US); John M. Rodgers, Pasadena, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/702,973

(22) PCT Filed: Jan. 6, 2012

(86) PCT No.: PCT/US2012/020504
§ 371 (c)(1), (2), (4) Date: Dec. 7, 2012

(87) PCT Pub. No.: WO2012/096847
PCT Pub. Date: Jul. 19, 2012

(65) Prior Publication Data
US 2013/0083321 A1    Apr. 4, 2013

Related U.S. Application Data

(60) Provisional application No. 61/431,768, filed on Jan. 11, 2011.

(51) Int. Cl.
*G01N 21/00* (2006.01)
*G03F 1/84* (2012.01)
*G03F 1/24* (2012.01)

(52) U.S. Cl.
CPC ... *G03F 1/84* (2013.01); *G03F 1/24* (2013.01)

USPC .................................... 356/239.3; 356/239.2

(58) Field of Classification Search
USPC ............. 356/239.2–239.3, 239.7–239.8, 356/237.1–237.6; 250/492.1; 355/43, 67; 359/846, 856, 857
See application file for complete search history.

(56) References Cited

U.S. PATENT DOCUMENTS

| 6,549,270 B1 | 4/2003 | Ota |
| 2002/0017616 A1 | 2/2002 | Ota |
| 2005/0201514 A1 | 9/2005 | Mann et al. |

(Continued)

OTHER PUBLICATIONS

International Search Report & Written Opinion of the ISA for international application No. PCT/US2012/020504, Aug. 30, 2012, 7 sheets.

*Primary Examiner* — Tri T Ton
(74) *Attorney, Agent, or Firm* — Okamoto & Benedicto LLP

(57) ABSTRACT

One embodiment relates to an apparatus that includes an illumination source (102) for illuminating a target substrate (106), objective optics (108) for projecting the EUV light which is reflected from the target substrate, and a sensor (110) for detecting the projected EUV light. The objective optics includes a first mirror (202, 302, or 402) which is arranged to receive and reflect the EUV light which is reflected from the target substrate, a second mirror (204, 304, or 404) which is arranged to receive and reflect the EUV light which is reflected by the first mirror, a third mirror (206, 306, or 406) which is arranged to receive and reflect the EUV light which is reflected by the second mirror, and a fourth mirror (208, 308, or 408) which is arranged to receive and reflect the EUV light which is reflected by the third mirror.

18 Claims, 4 Drawing Sheets

(56) References Cited

U.S. PATENT DOCUMENTS

| | | |
|---|---|---|
| 2009/0267003 A1 | 10/2009 | Moriya et al. |
| 2010/0165310 A1 | 7/2010 | Sewell et al. |
| 2011/0116077 A1* | 5/2011 | Chuang et al. .................. 356/51 |
| 2013/0083321 A1* | 4/2013 | Wack et al. ................ 356/239.3 |

* cited by examiner

FIG. 1          100

APPARATUS FOR EUV IMAGING AND METHODS OF USING SAME

CROSS-REFERENCE TO RELATED APPLICATION(S)

The present application claims the benefit of U.S. provisional patent application No. 61/431,768, entitled "Apparatus for EUV Imaging and Methods of Using Same," filed Jan. 11, 2011, the disclosure of which is hereby incorporated by reference.

BACKGROUND OF THE INVENTION

1. Technical Field

The present disclosure relates to optical apparatus and methods of using same.

2. Description of the Background Art

The conventional apparatus in the market for photomask inspection generally employ ultra-violet (UV) light with wavelengths at or above 193 nanometers (nm). This is suitable for masks designed for use in lithography based on 193 nm light. To improve further the printing of minimum feature sizes, next generation lithographic equipment is now designed for operation in the neighborhood of 13.5 nm. Accordingly, patterned masks designed for operation near 13 nm must be inspected. Such masks are reflective, having a patterned absorber layer over a resonantly-reflecting substrate (EUV multilayer, typically 40 pairs of MoSi with a 7 nm period. The conventional inspection apparatus uses optics with a combination of wavelength and numerical apertures (NA) that are not sufficient (i.e. too small) to resolve pattern features and pattern defects of interest (printable) in EUV mask patterns characterized by a half-pitch below 22 nanometers (nm).

SUMMARY

One embodiment disclosed relates to an apparatus for inspecting a photomask using extreme ultra-violet (EUV) light. The apparatus includes an illumination source for generating the EUV light which illuminates a target substrate, objective optics for receiving and projecting the EUV light which is reflected from the target substrate, and a sensor for detecting the EUV light which is projected by the objective optics. The objective optics includes a first mirror which is arranged to receive and reflect the EUV light which is reflected from the target substrate, a second mirror which is arranged to receive and reflect the EUV light which is reflected by the first mirror, a third mirror which is arranged to receive and reflect the EUV light which is reflected by the second mirror, and a fourth mirror which is arranged to receive and reflect the EUV light which is reflected by the third mirror.

Other embodiments, aspects and features are also disclosed.

DETAILED DESCRIPTION

Figure 1:
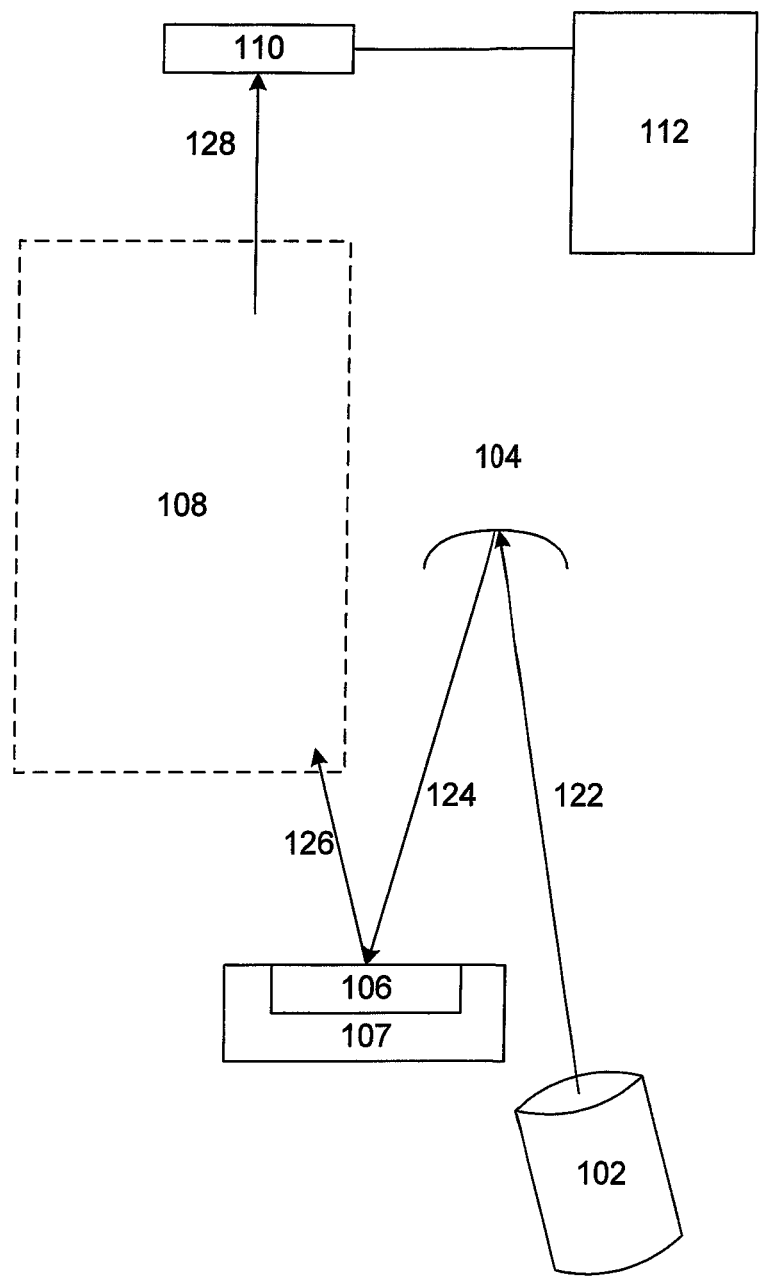
FIG. 1 is a schematic diagram of a reflective imaging apparatus in accordance with an embodiment of the invention.

EUV microscope objectives (having 2 to 4 multilayer-coated mirrors) disclosed previously, designed for defect or pattern review applications, with operation in the neighborhood of 13 nm wavelength of light, are based have NA in the range 0.05-0.12, and an object field extent just adequate to the review (microscopy) task—in the range of 5-20 microns at the mask. According to rigorous analyses of the defect detection capability as a function of NA and defect size, the resolving power and defect detection sensitivity of EUV objectives with NA in this range are inadequate for production-worthy EUV mask inspection of masks with feature half-pitch (HP) below 18 nm or so, due to shortcomings in both NA and high-quality object field size.

Current mask inspection systems are based on UV and DUV laser sources of light, which are high brightness and relatively high power. Light sources with significant spectral brightness in the neighborhood of 13 nm are based on pulsed plasmas, with temperatures in the range 20-50 eV. Due to poor conversion efficiency (conversion from input energy to in-band radiation), such plasma sources show limited brightness at 13-14 nm, and raising the brightness significantly can drive source cost (and thus inspection costs imposed on the mask during fabrication) to levels which impair the economic attractiveness of EUV Lithography (EUVL).

High-throughput operation of mask inspection systems with low brightness plasma sources (discharge or laser produced) drives the need for large object field and detector array, to increase the rate of instantaneous image signal integration and conversion to digital representation.

Simultaneously, to discriminate defect signals from background image noise, the imaging optics must maximize the collection of light diffracted or scattered by patterning or multilayer defects residing on the EUV mask of interest. For most defects of interest, which diffract and scatter the incident light over a wide range of angles, increasing the NA of the objective will provide an increase in defect signals.

Multilayer-mirror based imaging systems have poor transmission of light, due to the limited reflectivity of multilayers at the design wavelengths near 13-14 nm. A single MoSi multilayer mirror shows peak spectral reflectivity near 13.5 nm in the range of 60-70%. After multiple reflections from near-normal incidence mirrors in typical illumination and imaging optics in an EUV system, system transmission can fall below 1%.

To perform the inspection task adequately, the light reaching the image plane and converted to digital signals by the detector array, from each resolved region of the mask, must reach a certain number of primary (13 nm) quanta, and so a certain minimum signal-to-noise ratio, which in well designed systems is a strong function of the number of primary quanta (photons absorbed in the detector material, typically silicon). To compensate for losses in the optical system while keeping the light incident on the detector constant, the source brightness must be increased, which is difficult to develop and expensive to produce using currently known source technologies.

Alternatively, the range of angles emitted by the source which are transferred to the mask by the illumination optics can be increased, since the amount of light will increase with this angular range, at least within a range of angles supported by the source brightness. In other words, the illumination pupil size can be increased until a physical constraint intervenes. Rigorous studies of defect SNR in inspection optic designs have indicated that for EUV masks, such largely incoherent imaging often provides higher SNR than lower sigma, more coherent operation of the design and system, when used with plasma sources of limited brightness.

The use of beam splitters in reflective imaging systems used in conjunction with reflective objects (such as EUV mask inspection using EUV light) can simplify optical design and layout, by allowing interpenetration or overlap of illumination and imaging pupils in angle space. Current EUV beam splitter technology have low reflection and transmission coefficients (25-35%). Inspection systems with beamsplitters must increase source brightness greatly to compensate for the loss of light reaching the detector. Inspection optics without a beamsplitter element is thus strongly preferred.

Light at wavelengths within the spectral bandpass of the resonantly-reflecting multilayer incident on such a uniform (unpatterned) mirror is reflected at 60-70% only if the angle of incidence resides within the angular bandpass as well. Periodic MoSi multilayers have an angular bandpass of 20-25 degrees at 13.5 nm. Light incident outside of the angular bandpass is reflected by the multilayer at very low levels, and thus is largely absorbed, or wasted.

Rigorous studies of light propagation and diffraction by patterns on EUV masks indicates that this trend holds for light incident on patterned masks, as well. Furthermore, the angular distribution of light diffracted and scattered by defects present on or in the EUV patterned mask is also modulated by the angular bandpass of the multilayer. The angular distribution of light scattered by a defect depends as well on the defect geometry, and the geometry of the local pattern, and can be significantly skewed to one side of the imaging pupil or another. To collect adequate light from all defect types and for arbitrary pattern geometries, the size of the imaging pupil should be maximized. Consequently, design of inspection optics without a beamsplitter and which operate largely within the finite angular bandwidth of the mask, and which utilize plasma sources of limited brightness, must contend with competing angular claims of the illumination and imaging pupils, each of which seek to maximize the size of their angular extent.

EUVL at 11 HP may use aperiodic multilayers in the EUV mask design, which provide increased angular bandwidth, and enable EUVL imaging at higher NAs than possible with a conventional periodic multilayer design. This improves, but does not fully mitigate the issue of finite angular bandpass.

Although increasing the number of mirrors in an imaging design can provide design capability which enables simultaneous high NA and wide object field, this can lead to a prohibitive decrease in light reaching the detector. Thus, there is significant value in discovering designs which provide adequate inspection performance at minimum mirror count, which do not use a beam splitter, and which balance the competing needs of illuminating and imaging pupils sizes and locations, and thereby enable the production use of low brightness plasma-based EUV sources.

Furthermore, it is of strong economic interest to discover optical designs which provide adequate defect inspection performance for at least two technology nodes, for example 16 HP and 11 HP. As the critical defect size which limits chip yield shrinks with technology node, the NA of the inspection system should be increased to compensate for the reduction in scattered light.

In summary, conventional apparatus that utilize UV light are clearly limited when applied to inspect extreme ultraviolet photomasks ("EUV masks"). The conventional apparatus are typically "non-actinic" in that they result in an image of the mask that does not represent what will be realized using EUV light during lithography. Rather, the resultant image of the mask lacks both resolution and contrast, such that the image is not very useful for pattern inspection and defect detection.

More recently, photomask inspectors that use EUV light for imaging ("EUV inspectors") are being developed. However, the current EUV inspectors also have limitations and drawbacks. First, the field sizes of the images are very small. This limitation results in a low throughput when the apparatus is used to inspect entire EUV masks for defects. Second, numerical apertures of the optics are low. This limitation results in a relatively lower resolution. Such lower resolution limits the practical use of the images for pattern inspection and defect detection.

The present patent application discloses reflective imaging apparatus that overcome the above-discussed problems with photomask inspectors.

During inspection of patterned masks, acquisition and subsequent signal processing of the signal corresponding to a localized defective pattern can be accomplished by comparing or differencing the digital images from a test region of a pattern and a reference region, whether acquired or synthesized from prior information. Such difference operation removes the pattern, leaving the defect as a perturbation of a quasi-uniform background signal.

Imaging pupils are often circularly symmetric, leading to symmetric point spread functions at the image plane. While such symmetry is often required in lithography, mask inspection via difference imaging does not require symmetric psf, and consequently the imaging pupil can afford to be asymmetric. In particular, obscuration of a portion of the imaging pupil can be tolerated, if defect signal collection is not compromised significantly.

Additionally, the shape of the parent pupil need not be circular. For instance, square or rectangular shapes for the parent are possible, and even advantageous when considering the incremental gain of scattered defect light or signal through addition of pupil region.

Expressed as a fraction of pupil area, obscuration fractions less than 5 or 10% are preferred. Obscuration in 4-mirror designs is often created through the blocking or shadowing of light reflected or scattered from the mask by the second mirror, or M2. Minimizing the size of both reflecting surface and peripheral support of M2 will minimize obscuration.

The design of structural support for M2 must provide for sufficient rigidity, so that environmental disturbances or vibrations do not drive or lead to dynamic perturbations of M2 position and thus to degradation of image quality through blurring.

Since mirrors for EUV light must be coated with multilayers to reach adequate reflectivity, the range of incidence angles on any of the highly curved elements must be considered, and restricted within the limits of multilayer deposition process technology. When estimating the defect SNR of a particular objective and system design, the apodization or modulation of transmission of each light ray by local reflectivity variations at the point of reflection on each mirror induced by the multilayer deposition process must be considered.

In particular, the design process must balance obscuration, structural response and curvature factors in the geometry of the second mirror or M2, in order to secure the minimum viable defect SNR which enables fast and economic mask inspection.

The choice of chief ray in design of the objective for mask inspection must balance several competing factors. The chief ray is defined by the centroid of the angular distribution of light rays transmitted by the objective to the image plane; i.e., with due consideration of the pupil apodization caused by mirror coatings. Although conventional designs for reflective imaging without a beamsplitter place the plane dividing the illumination and collection light bundles on the optical axis and coincident with the object surface normal, inspection-oriented optics do not demand or strongly prefer this choice. Thus allowing placement of the lower marginal ray of the imaging pupil below the surface normal is found to be advantageous for defect signal collection.

Correspondingly, in the process of increasing defect SNR, as the NA is increased from low levels, in higher performance designs the imaging chief ray (relative to the surface normal) is below the numerical value of the NA. Inspection-optimized EUV objective designs bias the imaging chief rays toward the surface normal to maximize overlap of imaging pupil with multi-layer modulated angular distribution of light scattered by pattern defects, while providing sufficient angular range (still largely restricted to the multilayer angular bandpass) to the illumination pupil to secure adequate photon flux from the limited brightness plasma EUV sources.

FIG. 1 is a schematic diagram of a reflective imaging apparatus in accordance with an embodiment of the invention. The apparatus 100 includes an EUV illumination source 102, an illumination mirror 104, a target substrate 106, a substrate holder 107, objective optics 108, a sensor (detector) 110, and a data processing system 112.

The EUV illumination source 102 may comprise, for example, a laser-induced plasma source which outputs an EUV light beam 122. In one embodiment, the EUV light is at a wavelength of 13.5 nm. The illumination mirror 104 reflects the EUV light such that the beam 124 illuminates the target substrate 106. In one embodiment of the invention, the target substrate 106 is an EUV mask being inspection. The target substrate 106 may be scanned under the beam 124 by controllably translating the substrate holder 107 so that the field of view of the imaging apparatus covers regions on the substrate to be inspected.

Patterned light 126 is reflected from the target substrate 106 to the reflective objective optics 108. Preferred embodiments of the objective optics 108 are described in detail below in relation to FIGS. 2, 3 and 4.

The objective optics 108 outputs a projection 128 of the patterned light onto the sensor 110. In one embodiment, the sensor 110 may be a time-delay integration detector array so that the data may be detected while the target substrate is being scanned (translated) under the beam 124.

The data processing system 112 may include electronic circuitry, one or more microprocessors, data storage, memory and input and output devices. The data processing system 112 may be configured to receive and process data from the sensor 110. In accordance with one embodiment, the data processing system 112 may process and analyze the detected data for pattern inspection and defect detection.

Figure 2:
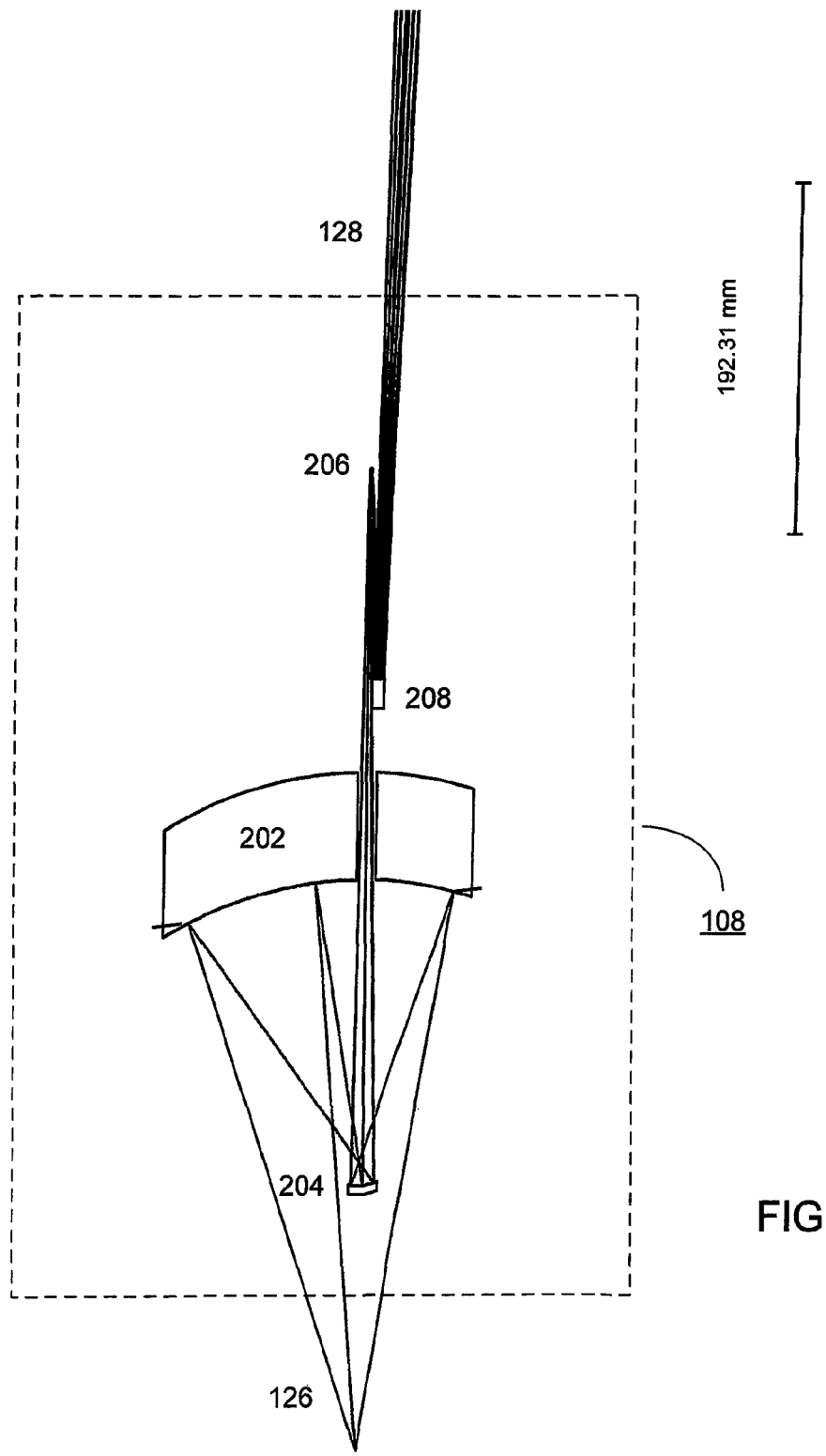
FIG. 2 is an optical ray diagram of a mirror distribution for reflective objective optics in accordance with a first embodiment of the invention.

FIG. 2 is an optical ray diagram of a mirror distribution for the objective optics 108 in accordance with a first embodiment of the invention. An optical prescription for the objective optics 108 in FIG. 2 is provided below in Appendix A.

In this embodiment, there are four mirrors (202, 204, 206, and 208) arranged as shown in FIG. 2. The mirrors are arranged such that the patterned light 126 reflects from the first, second, third, and fourth mirrors (202, 204, 206, and 208, respectively) in that order. In this arrangement, the first mirror 202 is concave, the second mirror 204 is concave, the third mirror 206 is convex, the fourth mirror 208 is concave. Hence, the mirrors are, in order: concave; concave; convex; and concave.

In this embodiment, the second mirror 204 partially obscures the first mirror 202 from the patterned light 126. In other words, part of the area of the first mirror 202 is blocked by the second mirror 204 from receiving the light 126 reflected from the target substrate 106. Furthermore, an opening in the first mirror 202 is used to let the light reflected by the second mirror 204 pass through to reach the third mirror 206. Applicants have determined that, despite the first mirror 202 being partially obscured and needing a pass-through hole, a high numerical aperture is nevertheless achieved with this embodiment.

In accordance with a preferred embodiment, the numerical aperture for the objective optics is at least 0.2, and the field of view is at least 5,000 square microns in area. For this implementation of the objective optics 108, the numerical aperture has been determined to be 0.24, and the size of the field of view has been determined to be 327 microns by 30 microns (9,810 square microns in area). Advantageously, both the numerical aperture and field of view are relatively large in this embodiment.

The working distance is the distance between the target substrate 106 and the nearest optical element (in this case, the second mirror 204). A working distance of at least 100 millimeters (mm) is desirable to provide sufficient space for illumination of the target substrate 106. In this embodiment, the working distance is 145 mm.

The total track may be defined as the distance from the target substrate 106 to the sensor 110. In this particular embodiment, the total trace is 1,500 mm.

Figure 3:
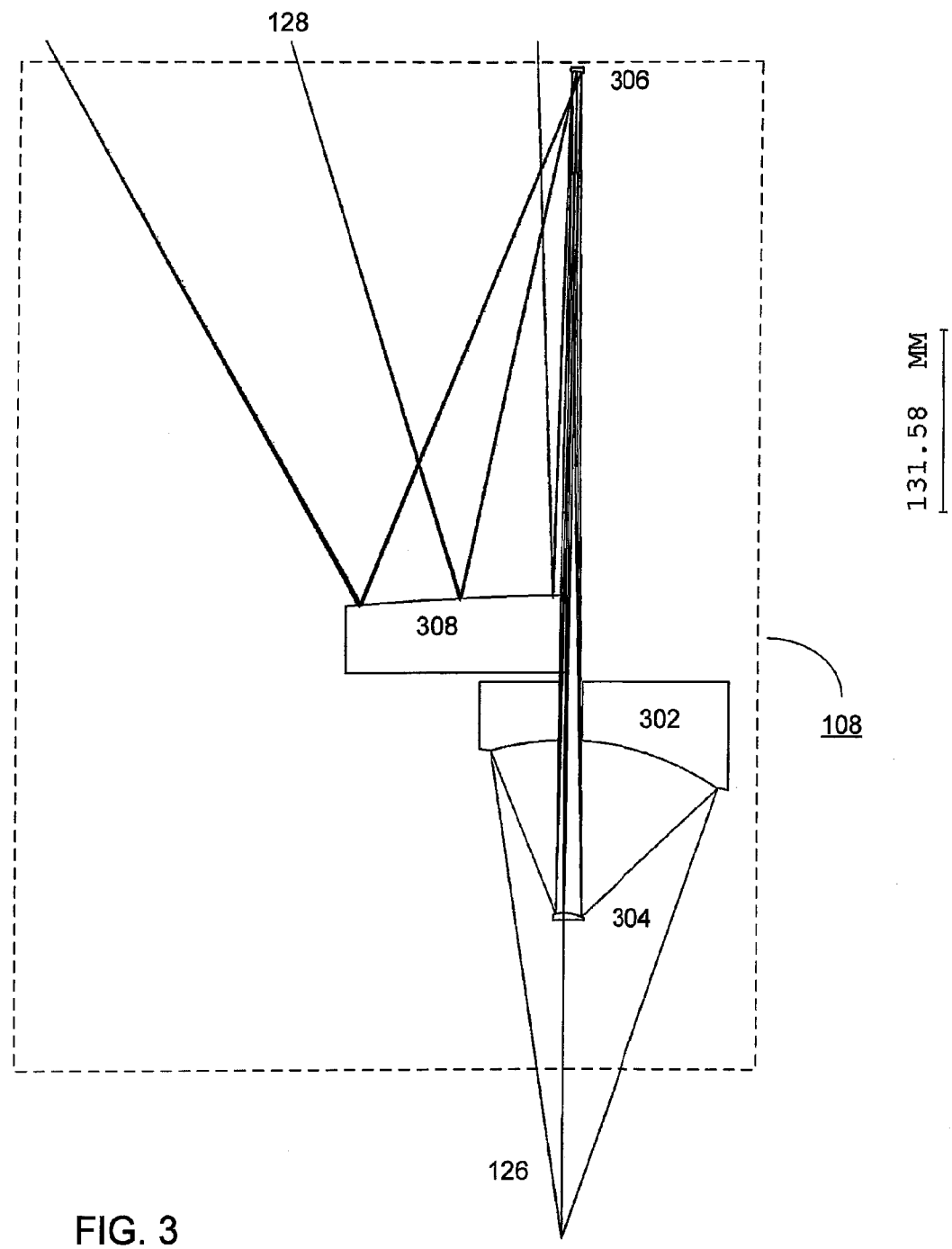
FIG. 3 is an optical ray diagram of a mirror distribution for reflective objective optics in accordance with a second embodiment of the invention.

FIG. 3 is an optical ray diagram of a mirror distribution for reflective objective optics in accordance with a second embodiment of the invention. An optical prescription for the objective optics 108 in FIG. 3 is provided below in Appendix B.

In this embodiment, there are four mirrors (302, 304, 306, and 308) arranged as shown in FIG. 3. The mirrors are arranged such that the patterned light 126 reflects from the first, second, third, and fourth mirrors (302, 304, 306, and 308, respectively) in that order. In this arrangement, the first mirror 302 is concave, the second mirror 304 is convex, the third mirror 306 is concave, the fourth mirror 308 is convex. Hence, the mirrors are, in order: concave; convex; concave; and convex.

In this embodiment, the second mirror 304 partially obscures the first mirror 302 from the patterned light 126. In other words, part of the area of the first mirror 302 is blocked by the second mirror 304 from receiving the light 126 reflected from the target substrate 106. Furthermore, an opening in the first mirror 302 is used to let the light reflected by the second mirror 304 pass through to reach the third mirror 306. Applicants have determined that, despite the first mirror 302 being partially obscured and needing a pass-through hole, a high numerical aperture is nevertheless achieved with this embodiment.

In accordance with a preferred embodiment, the numerical aperture for the objective optics is at least 0.2, and the field of view is at least 5,000 square microns in area. For this implementation of the objective optics 108, the numerical aperture has been determined to be 0.24, and the size of the field of view has been determined to be 440 microns by 420 microns (184,800 square microns in area). Advantageously, the numerical aperture is relatively large in this embodiment, and the field of view is particularly large. The large field of view advantageously enables multiple sensor columns.

The working distance is the distance between the target substrate 106 and the nearest optical element (in this case, the second mirror 304). A working distance of at least 100 millimeters (mm) is desirable to provide sufficient space for illumination of the target substrate 106. In this embodiment, the working distance is 237 mm.

The total track may be defined as the distance from the target substrate 106 to the sensor 110. In this particular embodiment, the total trace is 873 mm.

Figure 4:
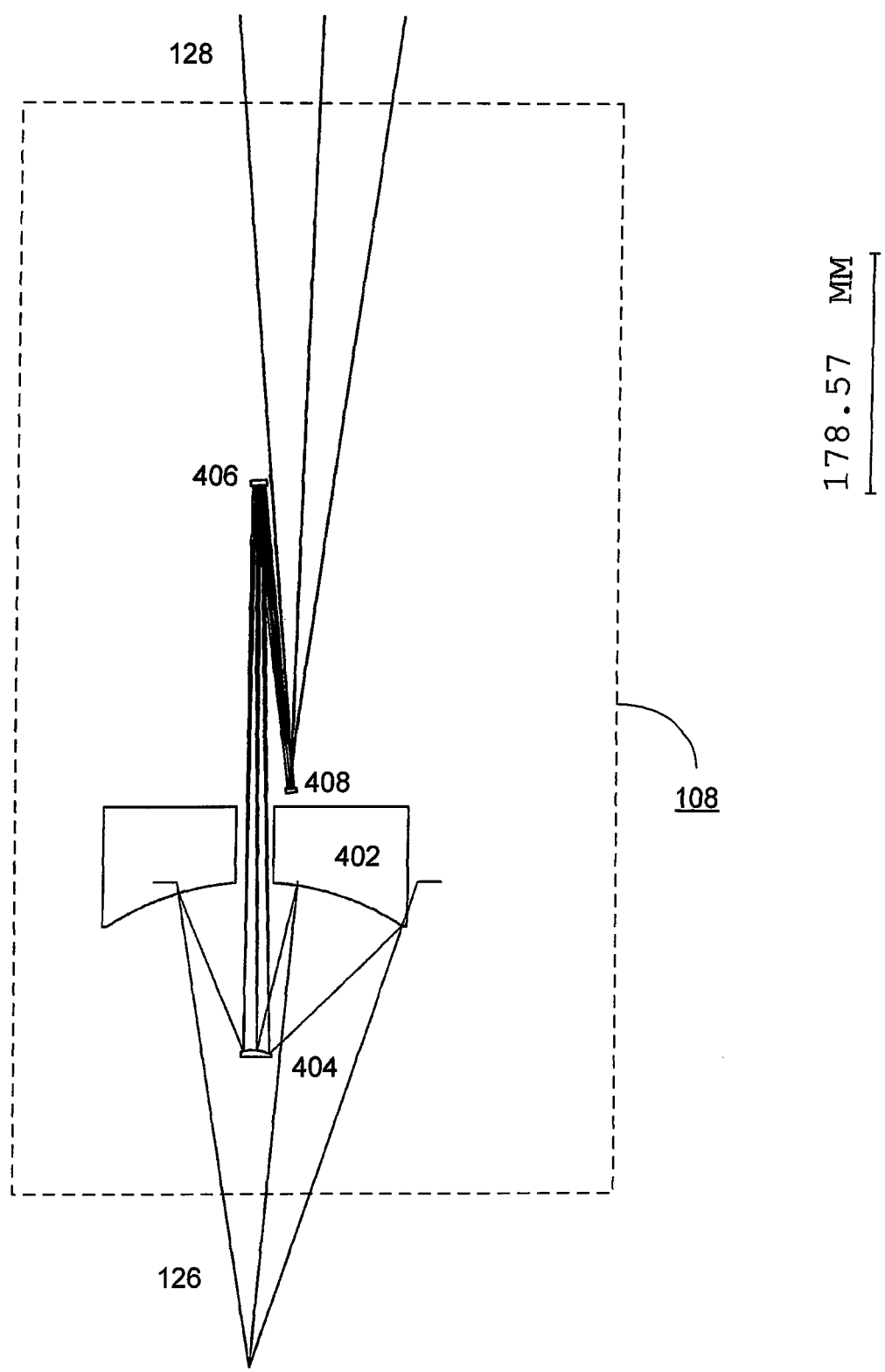
FIG. 4 is an optical ray diagram of a mirror distribution for reflective objective optics in accordance with a third embodiment of the invention.

FIG. 4 is an optical ray diagram of a mirror distribution for reflective objective optics in accordance with a third embodiment of the invention. An optical prescription for the objective optics 108 in FIG. 4 is provided below in Appendix C.

In this embodiment, there are four mirrors (402, 404, 406, and 408) arranged as shown in FIG. 4. The mirrors are arranged such that the patterned light 126 reflects from the first, second, third, and fourth mirrors (402, 404, 406, and 408, respectively) in that order. In this arrangement, the first mirror 402 is concave, the second mirror 404 is convex, the third mirror 406 is concave, the fourth mirror 408 is concave. Hence, the mirrors are, in order: concave; convex; concave; and concave.

In this embodiment, the second mirror 404 partially obscures the first mirror 402 from the patterned light 126. In other words, part of the area of the first mirror 402 is blocked by the second mirror 404 from receiving the light 126 reflected from the target substrate 106. Furthermore, an opening in the first mirror 402 is used to let the light reflected by the second mirror 404 pass through to reach the third mirror 406. Applicants have determined that, despite the first mirror 402 being partially obscured and needing a pass-through hole, a high numerical aperture is nevertheless achieved with this embodiment.

In accordance with a preferred embodiment, the numerical aperture for the objective optics is at least 0.2, and the field of view is at least 5,000 square microns in area. For this implementation of the objective optics 108, the numerical aperture has been determined to be 0.24, and the size of the field of view has been determined to be 410 microns by 255 microns (104,550 square microns in area). Advantageously, the numerical aperture is relatively large in this embodiment, and the field of view is also large.

The working distance is the distance between the target substrate 106 and the nearest optical element (in this case, the second mirror 404). A working distance of at least 100 millimeters (mm) is desirable to provide sufficient space for illumination of the target substrate 106. In this embodiment, the working distance is 230 mm.

The total track may be defined as the distance from the target substrate 106 to the sensor 110. In this particular embodiment, the total trace is 1,420 mm.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

APPENDIX A

Optical Prescription for Objective Optics depicted in FIG. 2.

Form: PPNP (type K)

| ELT NO. | SUR NO. | SURFACE DESCRIPTION RADIUS X | Y | SHAPE | THICKNESS OR SEPARATION | APERTURE DESCRIPTION DIMENSION X | Y | SHAPE | MATERIAL |
|---|---|---|---|---|---|---|---|---|---|
| OBJECT | | INF | | FLT | 171.5840 | | | | |
| | | DECENTER( 1) | | | -31.2583 | 114.258 | | CIR | |
| | | | | | 157.5932 | 93.435 | 93.435 | C-1 | |
| (STOP) | 1 | DECENTER( 2) | | | 15.2460 | 152.732 | 152.685 | C-2 | |
| | | RETURN( 2) | | | | | | | |
| 1 | 2 | -207.101 | | A-1 | -167.7470 | 167.526 | 166.181 | C-3 | REFL |
| 2 | 3 | 25.266 | | A-2 | 87.7476 | 14.523 | 14.282 | C-4 | REFL |
| | | | | | 79.9994 | 13.380 | | CIR | |
| | | | | | 223.0383 | 10.546 | | C-5 | |
| | | | | | 0.1102 | 5.454 | | CIR | |
| 3 | 4 | 21.112 | | A-3 | -113.1924 | 5.712 | 0.899 | C-6 | REFL |
| 4 | 5 | 439.339 | | A-4 | 1076.8791 | 64.605 | 6.679 | C-7 | REFL |
| IMAGE | | INF | | FLT | | 293.920 | | | |

NOTES
- Positive radius indicates the center of curvature is to the right
  Negative radius indicates the center of curvature is to the left
- Dimensions are given in millimeters
- Thickness is axial distance to next surface
- Image diameter shown above is a paraxial value, it is not a ray traced value

APERTURE DATA

| APERTURE | SHAPE | | DIAMETER X | Y | DECENTER X | Y | ROTATION |
|---|---|---|---|---|---|---|---|
| C- 1 | CIRCLE | | 93.435 | | | | |
| | ELLIPS | (OBSC) | 14.282 | 14.523 | 0.000 | -2.136 | 0.0 |
| | RECTANGLE | (OBSC) | 14.523 | 42.846 | 0.000 | -23.559 | 0.0 |
| C- 2 | ELLIPS | | 152.732 | 152.685 | 0.000 | -0.029 | 0.0 |
| C- 3 | ELLIPS | | 167.526 | 166.181 | 0.000 | 24.513 | 0.0 |

|       |           |        |        |        |       |        |     |
|-------|-----------|--------|--------|--------|-------|--------|-----|
|       | CIRCLE    | (OBSC) | 10.546 | 10.546 | 0.000 | -1.495 | 0.0 |
| C- 4  | ELLIPS    |        | 14.523 | 14.282 | 0.000 | -2.136 | 0.0 |
| C- 5  | CIRCLE    |        | 10.546 | 10.546 | 0.000 | -1.495 | 0.0 |
| C- 6  | RECTANGLE |        | 5.712  | 0.899  | 0.000 | -0.619 | 0.0 |
| C- 7  | RECTANGLE |        | 64.605 | 6.679  | 0.000 | -6.786 | 0.0 |

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$
$$+ (E)Y^{12} + (F)Y^{14} + (G)Y^{16} + (H)Y^{18} + (J)Y^{20}$$

| ASPHERIC | CURV        | K            | A            | B            | C            |
|----------|-------------|--------------|--------------|--------------|--------------|
| D        |             | E            | F            | G            | H            |
| J        |             |              |              |              |              |
| A- 1     | -0.00482857 | -0.092398    | 4.73666E-10  | 1.00934E-14  | 1.65866E-19  |
| 6.57843E-24 |          | 0.00000E+00  | 0.00000E+00  | 0.00000E+00  | 0.00000E+00  |
| 0.00000E+00 |          |              |              |              |              |
| A- 2     | 0.03957902  | 0.557074     | -7.96262E-06 | -1.22560E-08 | -3.24562E-11 |
| 1.31052E-13 |          | -9.70137E-16 | 0.00000E+00  | 0.00000E+00  | 0.00000E+00  |
| 0.00000E+00 |          |              |              |              |              |
| A- 3     | 0.04736557  | -0.131506    | -2.22840E-06 | -9.90910E-09 | 2.45154E-10  |
| 0.00000E+00 |          | 0.00000E+00  | 0.00000E+00  | 0.00000E+00  | 0.00000E+00  |
| 0.00000E+00 |          |              |              |              |              |
| A- 4     | 0.00227615  | 0.000000     | -4.22762E-09 | 0.00000E+00  | 0.00000E+00  |
| 0.00000E+00 |          | 0.00000E+00  | 0.00000E+00  | 0.00000E+00  | 0.00000E+00  |
| 0.00000E+00 |          |              |              |              |              |

DECENTERING CONSTANTS

| DECENTER | X      | Y       | Z      | ALPHA  | BETA   | GAMMA  |
|----------|--------|---------|--------|--------|--------|--------|
| D( 1)    | 0.0000 | 0.0377  | 0.0000 | 0.0000 | 0.0000 | 0.0000 |
| D( 2)    | 0.0000 | 24.8300 | 0.0000 | 6.6732 | 0.0000 | 0.0000 |
| (RETU)   |        |         |        |        |        |        |

A decenter defines a new coordinate system (displaced and/or rotated)
in which subsequent surfaces are defined. Surfaces following a decenter
are aligned on the local mechanical axis (z-axis) of the new coordinate
system. The new mechanical axis remains in use until changed by another
decenter. The order in which displacements and tilts are applied on a
given surface is specified using different decenter types and these
generate different new coordinate systems; those used here are explained
below. Alpha, beta, and gamma are in degrees.

DECENTERING CONSTANT KEY:

TYPE          TRAILING CODE         ORDER OF APPLICATION

```
        DECENTER                           DISPLACE (X,Y,Z)
                                           TILT (ALPHA,BETA,GAMMA)
                                           REFRACT AT SURFACE
                                           THICKNESS TO NEXT SURFACE

DECENTER & RETURN      RETU        DECENTER (X,Y,Z,ALPHA,BETA,GAMMA)
                                           REFRACT AT SURFACE
                                           RETURN (-GAMMA,-BETA,-ALPHA,-Z,-Y,-X)
                                           THICKNESS TO NEXT SURFACE
```

REFERENCE WAVELENGTH =      13.5 NM

```
    This is a non-symmetric system.  If elements with power are
    decentered or tilted, the first order properties are probably
    inadequate in describing the system characteristics.

INFINITE CONJUGATES      X           Y
      EFL            =    -1.5852     -1.5852
      BFL            =  -281.8874   -281.8874
      FFL            =  -171.5821   -171.5821
      F/NO           =    -0.0107     -0.0107

AT USED CONJUGATES
      REDUCTION      =  -860.5581   -860.5581
      FINITE F/NO    = -1787.6352  -1776.3433
      OBJECT DIST    =   171.5840    171.5840
      TOTAL TRACK    =  1500.0000   1500.0000
      IMAGE DIST     =  1076.8791   1076.8791
      OAL            =   251.5370    251.5370
      PARAXIAL
        IMAGE HT     =   104.2136      1.0040
        IMAGE DIST   =  1082.2952   1082.2952
      SEMI-FIELD
        ANGLE        =    80.1437      3.1738
      ENTR PUPIL
        DIAMETER     =   147.8187    148.7584
        DISTANCE     =   126.3350    126.3350
      EXIT PUPIL
        DIAMETER     =     0.7865      0.7915
        DISTANCE     =  -281.8958   -281.8958
```

NOTES - FFL is measured from the first surface
      - BFL is measured from the last surface PPNP_CaseK_120110

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|

A( 1)  -0.00482857   -0.092398  0.473666E-09  0.100934E-13  0.165866E-18  0.657843E-23

CURVATURE OF BEST SPHERE =  -0.004794
RADIUS OF BEST SPHERE =     -208.591

| Y | ASPH SAG (Z) | SPHERE SAG | SAG DIFFERENCE |
|---|---|---|---|
| 0.000000  | 0.000000   | 0.000000   | 0.000000 |
| 3.857000  | -0.035919  | -0.035662  | 0.000256 |
| 7.714000  | -0.143708  | -0.142686  | 0.001021 |
| 11.571000 | -0.323465  | -0.321182  | 0.002283 |
| 15.428000 | -0.575355  | -0.571333  | 0.004022 |
| 19.285000 | -0.899608  | -0.893398  | 0.006209 |
| 23.142000 | -1.296523  | -1.287713  | 0.008810 |
| 26.999000 | -1.766468  | -1.754691  | 0.011777 |
| 30.856000 | -2.309882  | -2.294825  | 0.015057 |
| 34.713000 | -2.927276  | -2.908692  | 0.018584 |
| 38.570000 | -3.619238  | -3.596954  | 0.022284 |
| 42.427000 | -4.386433  | -4.360362  | 0.026070 |
| 46.284000 | -5.229607  | -5.199764  | 0.029843 |
| 50.141000 | -6.149595  | -6.116105  | 0.033490 |
| 53.998000 | -7.147317  | -7.110433  | 0.036884 |
| 57.855000 | -8.223792  | -8.183911  | 0.039881 |
| 61.712000 | -9.380135  | -9.337817  | 0.042318 |
| 65.569000 | -10.617572 | -10.573557 | 0.044015 |
| 69.426000 | -11.937439 | -11.892674 | 0.044765 |
| 73.283000 | -13.341195 | -13.296857 | 0.044339 |
| 77.140000 | -14.830431 | -14.787955 | 0.042477 |
| 80.997000 | -16.406878 | -16.367990 | 0.038887 |
| 84.854000 | -18.072418 | -18.039176 | 0.033241 |
| 88.711000 | -19.829100 | -19.803933 | 0.025167 |
| 92.568000 | -21.679156 | -21.664911 | 0.014246 |
| 96.425000 | -23.625013 | -23.625013 | 0.000000 |

PPNP_CaseK_120110

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K | A | B | C | D |
|---|---|---|---|---|---|---|
| | | E | F | G | H | J |

A( 2)  0.03957902   0.557074  -0.796262E-05  -0.122560E-07  -0.324562E-10  0.131052E-12
               -0.970137E-15  0.000000E+00  0.000000E+00  0.000000E+00  0.000000E+00

CURVATURE OF BEST SPHERE =  0.039040
RADIUS OF BEST SPHERE =     25.615

| Y | ASPH SAG (Z) | SPHERE SAG | SAG DIFFERENCE |
|---|---|---|---|
| 0.000000 | 0.000000 | 0.000000 | 0.000000 |
| 0.332000 | 0.002181 | 0.002152 | -0.000030 |
| 0.664000 | 0.008726 | 0.008608 | -0.000118 |

| | | | |
|---|---|---|---|
| 0.996000 | 0.019636 | 0.019371 | -0.000264 |
| 1.328000 | 0.034913 | 0.034448 | -0.000465 |
| 1.660000 | 0.054563 | 0.053846 | -0.000717 |
| 1.992000 | 0.078591 | 0.077574 | -0.001017 |
| 2.324000 | 0.107003 | 0.105645 | -0.001358 |
| 2.656000 | 0.139807 | 0.138073 | -0.001734 |
| 2.988000 | 0.177013 | 0.174874 | -0.002138 |
| 3.320000 | 0.218630 | 0.216068 | -0.002562 |
| 3.652000 | 0.264671 | 0.261677 | -0.002994 |
| 3.984000 | 0.315148 | 0.311723 | -0.003425 |
| 4.316000 | 0.370076 | 0.366233 | -0.003842 |
| 4.648000 | 0.429470 | 0.425237 | -0.004232 |
| 4.980000 | 0.493348 | 0.488766 | -0.004581 |
| 5.312000 | 0.561727 | 0.556855 | -0.004873 |
| 5.644000 | 0.634629 | 0.629540 | -0.005089 |
| 5.976000 | 0.712073 | 0.706862 | -0.005212 |
| 6.308000 | 0.794084 | 0.788864 | -0.005220 |
| 6.640000 | 0.880686 | 0.875593 | -0.005092 |
| 6.972000 | 0.971904 | 0.967099 | -0.004805 |
| 7.304000 | 1.067767 | 1.063435 | -0.004332 |
| 7.636000 | 1.168304 | 1.164658 | -0.003646 |
| 7.968000 | 1.273546 | 1.270829 | -0.002717 |
| 8.300000 | 1.383527 | 1.382014 | -0.001513 |
| 8.632000 | 1.498281 | 1.498281 | 0.000000 |

---

PPNP_CaseK_120110

---

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A( 3) | 0.04736557 | -0.131506 | -0.222840E-05 | -0.990910E-08 | 0.245154E-09 | 0.000000E+00 |

CURVATURE OF BEST SPHERE = 0.047274
RADIUS OF BEST SPHERE = 21.153

| Y | ASPH SAG (Z) | SPHERE SAG | SAG DIFFERENCE |
|---|---|---|---|
| 0.000000 | 0.000000 | 0.000000 | 0.000132 |
| 0.109000 | 0.000281 | 0.000281 | 0.000132 |
| 0.218000 | 0.001126 | 0.001123 | 0.000130 |
| 0.327000 | 0.002532 | 0.002528 | 0.000127 |
| 0.436000 | 0.004502 | 0.004494 | 0.000124 |
| 0.545000 | 0.007035 | 0.007022 | 0.000119 |
| 0.654000 | 0.010131 | 0.010112 | 0.000113 |
| 0.763000 | 0.013791 | 0.013765 | 0.000107 |
| 0.872000 | 0.018013 | 0.017981 | 0.000100 |
| 0.981000 | 0.022800 | 0.022760 | 0.000092 |
| 1.090000 | 0.028151 | 0.028102 | 0.000083 |
| 1.199000 | 0.034066 | 0.034008 | 0.000074 |
| 1.308000 | 0.040545 | 0.040478 | 0.000065 |
| 1.417000 | 0.047590 | 0.047514 | 0.000056 |
| 1.526000 | 0.055200 | 0.055115 | 0.000047 |
| 1.635000 | 0.063376 | 0.063282 | 0.000038 |
| 1.744000 | 0.072118 | 0.072015 | 0.000029 |
| 1.853000 | 0.081427 | 0.081316 | 0.000021 |
| 1.962000 | 0.091304 | 0.091186 | 0.000014 |
| 2.071000 | 0.101748 | 0.101624 | 0.000008 |
| 2.180000 | 0.112761 | 0.112632 | 0.000004 |

| | | | |
|---|---|---|---|
| 2.289000 | 0.124342 | 0.124211 | 0.000001 |
| 2.398000 | 0.136494 | 0.136362 | 0.000000 |
| 2.507000 | 0.149216 | 0.149085 | 0.000001 |
| 2.616000 | 0.162509 | 0.162382 | 0.000005 |
| 2.725000 | 0.176374 | 0.176254 | 0.000012 |

PPNP_CaseK_120110

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A(4) | 0.00227615 | 0.000000 | -0.422762E-08 | 0.000000E+00 | 0.000000E+00 | 0.000000E+00 |

CURVATURE OF BEST SPHERE = 0.002267
RADIUS OF BEST SPHERE = 441.054

| Y | ASPH SAG (Z) | SPHERE SAG | SAG DIFFERENCE |
|---|---|---|---|
| 0.000000 | 0.000000 | 0.000000 | 0.000000 |
| 1.247000 | 0.001770 | 0.001763 | -0.000007 |
| 2.494000 | 0.007079 | 0.007051 | -0.000027 |
| 3.741000 | 0.015927 | 0.015866 | -0.000061 |
| 4.988000 | 0.028314 | 0.028206 | -0.000108 |
| 6.235000 | 0.044239 | 0.044073 | -0.000166 |
| 7.482000 | 0.063701 | 0.063466 | -0.000235 |
| 8.729000 | 0.086700 | 0.086387 | -0.000313 |
| 9.976000 | 0.113234 | 0.112836 | -0.000399 |
| 11.223000 | 0.143303 | 0.142812 | -0.000491 |
| 12.470000 | 0.176905 | 0.176318 | -0.000586 |
| 13.717000 | 0.214038 | 0.213354 | -0.000684 |
| 14.964000 | 0.254701 | 0.253921 | -0.000780 |
| 16.211000 | 0.298891 | 0.298019 | -0.000872 |
| 17.458000 | 0.346608 | 0.345650 | -0.000958 |
| 18.705000 | 0.397849 | 0.396815 | -0.001033 |
| 19.952000 | 0.452611 | 0.451516 | -0.001095 |
| 21.199000 | 0.510891 | 0.509753 | -0.001139 |
| 22.446000 | 0.572689 | 0.571528 | -0.001161 |
| 23.693000 | 0.638000 | 0.636842 | -0.001158 |
| 24.940000 | 0.706821 | 0.705697 | -0.001124 |
| 26.187000 | 0.779150 | 0.778095 | -0.001055 |
| 27.434000 | 0.854983 | 0.854037 | -0.000946 |
| 28.681000 | 0.934317 | 0.933526 | -0.000792 |
| 29.928000 | 1.017149 | 1.016562 | -0.000586 |
| 31.175000 | 1.103474 | 1.103149 | -0.000325 |
| 32.422000 | 1.193288 | 1.193288 | 0.000000 |

APPENDIX B

Optical Prescription for Objective Optics depicted in FIG. 3.

Form: PNPN (type E)

```
            SURFACE DESCRIPTION  THICKNESS  APERTURE DESCRIPTION
  ELT SUR     RADIUS      SHAPE     OR          DIMENSION      SHAPE   MATERIAL
  NO. NO.   X         Y           SEPARATION    X        Y
  ---------------------------------------------------------------------------------

OBJECT    INF              FLT   231.9676

130.9218   161.906  161.906  C-1

1   1   -202.870    A-1  -125.7510         168.744           C-2    REFL
  (STOP)

2   2   -30.857     A-2   125.7510          20.585   20.683  C-3    REFL 483.2695          22.288           CIR 1.9055          11.572           CIR 3   3   -36.145     A-3     0.0000           7.765    5.068  C-4    REFL

DECENTER( 1)
                             100.0000          291.037          CIR 4   4   2247.520 CC  SPH    0.0000         142.734   89.218  C-5    REFL

DECENTER( 2)
                             572.8054         382.502           CIR

IMAGE     INF          FLT                  615.460
```

NOTES - Positive radius indicates the center of curvature is to the right
        Negative radius indicates the center of curvature is to the left
      - Dimensions are given in millimeters

- Thickness is axial distance to next surface

- Image diameter shown above is a paraxial value,
        it is not a ray traced value

APERTURE DATA

```
                                   DIAMETER              DECENTER
   APERTURE  SHAPE              X          Y          X          Y      ROTATION
   ---------------------------------------------------------------------------------

C- 1    CIRCLE           161.906
            ELLIPS   (OBSC)   22.643     22.752     0.000     -3.554     0.0
            RECTANGLE (OBSC)  20.585     76.760     0.000     34.826     0.0

C- 2    CIRCLE           168.744    168.744     0.000    -30.154     0.0

C- 3    ELLIPS            20.585     20.683     0.000     -3.554     0.0
```

|  |  |  |  |  |  |  |
|---|---|---|---|---|---|---|
| C- 4 | RECTANGLE | 7.765 | 5.068 | 0.000 | -2.531 | 0.0 |
| C- 5 | RECTANGLE | 142.734 | 89.218 | 0.000 | 52.791 | 0.0 |

---

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A- 1 | -0.00492927 | -0.180985 | 0.00000E+00 | -1.59047E-16 | -3.25151E-21 | -1.95259E-25 |
| A- 2 | -0.03240743 | -0.742876 | 0.00000E+00 | -8.96537E-11 | -3.90040E-14 | 0.00000E+00 |
| A- 3 | -0.02766624 | -4.312119 | -8.98165E-06 | 9.34802E-09 | 0.00000E+00 | 0.00000E+00 |

---

DECENTERING CONSTANTS

| DECENTER | X | Y | Z | ALPHA | BETA | GAMMA |
|---|---|---|---|---|---|---|
| D( 1) | 0.0000 | 0.0000 | -485.1750 | 0.0000 | 0.0000 | 0.0000 |
| D( 2) | 0.0000 | 0.0000 | 385.1750 | 0.0000 | 0.0000 | 0.0000 |

A decenter defines a new coordinate system (displaced and/or rotated) in which subsequent surfaces are defined. Surfaces following a decenter are aligned on the local mechanical axis (z-axis) of the new coordinate system. The new mechanical axis remains in use until changed by another decenter. The order in which displacements and tilts are applied on a given surface is specified using different decenter types and these generate different new coordinate systems; those used here are explained below. Alpha, beta, and gamma are in degrees.

DECENTERING CONSTANT KEY:

| TYPE | TRAILING CODE | ORDER OF APPLICATION |
|---|---|---|
| DECENTER |  | DISPLACE (X,Y,Z)<br>TILT (ALPHA,BETA,GAMMA)<br>REFRACT AT SURFACE<br>THICKNESS TO NEXT SURFACE |

---

REFERENCE WAVELENGTH =    13.5 NM

---

This is a non-symmetric system. If elements with power are decentered or tilted, the first order properties are probably inadequate in describing the system characteristics.

INFINITE CONJUGATES
    EFL    =    -1.7535

```
    BFL      =   -929.1867
    FFL      =   -231.9655
    F/NO     =     -0.0069
AT USED CONJUGATES
    REDUCTION   =   -856.6454
    FINITE F/NO =  -1291.5539
    OBJECT DIST =    231.9676
    TOTAL TRACK =   1420.8698
    IMAGE DIST  =    572.8054
    OAL         =    616.0968
    PARAXIAL
      IMAGE HT  =    252.7104
      IMAGE DIST =   572.9594
    SEMI-FIELD
      ANGLE     =      0.0466
    ENTR PUPIL
      DIAMETER  =    255.1309
      DISTANCE  =    130.9218
    EXIT PUPIL
      DIAMETER  =      1.2328
      DISTANCE  =   -929.1951
```

NOTES - FFL is measured from the first surface
      - BFL is measured from the last surface schwarschild_4m857x_n.len

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A( 1) | -0.00492927 | -0.180985 | 0.000000E+00 | -0.159047E-15 | -0.325151E-20 | -0.195259E-24 |

CURVATURE OF BEST SPHERE = -0.004847
RADIUS OF BEST SPHERE    =  -206.293

| Y | ASPH SAG (Z) | SPHERE SAG | SAG DIFFERENCE |
|---|---|---|---|
| 0.000000 | 0.000000 | 0.000000 | 0.000000 |
| 4.581000 | -0.051727 | -0.050870 | 0.000857 |
| 9.162000 | -0.206973 | -0.203555 | 0.003419 |
| 13.743000 | -0.465934 | -0.458281 | 0.007652 |
| 18.324000 | -0.828934 | -0.815429 | 0.013505 |
| 22.905000 | -1.296435 | -1.275533 | 0.020903 |
| 27.486000 | -1.869033 | -1.839288 | 0.029745 |
| 32.067000 | -2.547463 | -2.507555 | 0.039908 |
| 36.648000 | -3.332608 | -3.281366 | 0.051242 |
| 41.229000 | -4.225500 | -4.161933 | 0.063567 |
| 45.810000 | -5.227329 | -5.150658 | 0.076672 |
| 50.391000 | -6.339452 | -6.249144 | 0.090308 |
| 54.972000 | -7.563402 | -7.459211 | 0.104191 |
| 59.553000 | -8.900898 | -8.782910 | 0.117988 |
| 64.134000 | -10.353861 | -10.222542 | 0.131319 |
| 68.715000 | -11.924425 | -11.780682 | 0.143743 |

| | | | |
|---|---|---|---|
| 73.296000 | -13.614959 | -13.460201 | 0.154758 |
| 77.877000 | -15.428082 | -15.264302 | 0.163780 |
| 82.458000 | -17.366692 | -17.196550 | 0.170142 |
| 87.039000 | -19.433986 | -19.260917 | 0.173069 |
| 91.620000 | -21.633496 | -21.461829 | 0.171667 |
| 96.201000 | -23.969125 | -23.804228 | 0.164897 |
| 100.782000 | -26.445185 | -26.293636 | 0.151549 |
| 105.363000 | -29.066452 | -28.936245 | 0.130207 |
| 109.944000 | -31.838218 | -31.739010 | 0.099208 |
| 114.525000 | -34.766367 | -34.709782 | 0.056584 |
| 119.106000 | -37.857450 | -37.857450 | 0.000000 |

--- schwarschild_4m857x_n.len

---

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A( 2) | -0.03240743 | -0.742876 | 0.000000E+00 | -0.896537E-10 | -0.390040E-13 | 0.000000E+00 |

CURVATURE OF BEST SPHERE = -0.031374
RADIUS OF BEST SPHERE = -31.873

| Y | ASPH SAG (Z) | SPHERE SAG | SAG DIFFERENCE |
|---|---|---|---|
| 0.000000 | 0.000000 | 0.000000 | -0.022846 |
| 0.518000 | -0.004348 | -0.004209 | -0.022707 |
| 1.036000 | -0.017393 | -0.016841 | -0.022294 |
| 1.554000 | -0.039137 | -0.037906 | -0.021614 |
| 2.072000 | -0.069586 | -0.067419 | -0.020679 |
| 2.590000 | -0.108745 | -0.105405 | -0.019505 |
| 3.108000 | -0.156625 | -0.151894 | -0.018115 |
| 3.626000 | -0.213234 | -0.206924 | -0.016535 |
| 4.144000 | -0.278586 | -0.270538 | -0.014798 |
| 4.662000 | -0.352695 | -0.342790 | -0.012941 |
| 5.180000 | -0.435577 | -0.423739 | -0.011008 |
| 5.698000 | -0.527251 | -0.513451 | -0.009046 |
| 6.216000 | -0.627737 | -0.612003 | -0.007112 |
| 6.734000 | -0.737058 | -0.719479 | -0.005267 |
| 7.252000 | -0.855238 | -0.835970 | -0.003578 |
| 7.770000 | -0.982306 | -0.961580 | -0.002120 |
| 8.288000 | -1.118289 | -1.096419 | -0.000976 |
| 8.806000 | -1.263219 | -1.240609 | -0.000236 |
| 9.324000 | -1.417130 | -1.394284 | 0.000000 |
| 9.842000 | -1.580058 | -1.557587 | -0.000375 |
| 10.360000 | -1.752042 | -1.730675 | -0.001479 |
| 10.878000 | -1.933123 | -1.913718 | -0.003440 |
| 11.396000 | -2.123346 | -2.106899 | -0.006399 |
| 11.914000 | -2.322756 | -2.310416 | -0.010506 |
| 12.432000 | -2.531403 | -2.524486 | -0.015928 |
| 12.950000 | -2.749340 | -2.749340 | -0.022846 |

--- schwarschild_4m857x_n.len

---

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A( 3) | -0.02766624 | -4.312119 | -0.898165E-05 | 0.934802E-08 | 0.000000E+00 | 0.000000E+00 |

CURVATURE OF BEST SPHERE = -0.027493
RADIUS OF BEST SPHERE = -36.373

| Y | ASPH SAG (Z) | SPHERE SAG | SAG DIFFERENCE |
|---|---|---|---|
| 0.000000 | 0.000000 | 0.000000 | 0.000000 |
| 0.232000 | -0.000745 | -0.000740 | 0.000005 |
| 0.464000 | -0.002978 | -0.002960 | 0.000019 |
| 0.696000 | -0.006701 | -0.006660 | 0.000041 |
| 0.928000 | -0.011913 | -0.011840 | 0.000073 |
| 1.160000 | -0.018614 | -0.018502 | 0.000112 |
| 1.392000 | -0.026805 | -0.026646 | 0.000159 |
| 1.624000 | -0.036485 | -0.036273 | 0.000212 |
| 1.856000 | -0.047654 | -0.047384 | 0.000270 |
| 2.088000 | -0.060313 | -0.059981 | 0.000332 |
| 2.320000 | -0.074462 | -0.074065 | 0.000397 |
| 2.552000 | -0.090101 | -0.089638 | 0.000462 |
| 2.784000 | -0.107229 | -0.106702 | 0.000528 |
| 3.016000 | -0.125849 | -0.125258 | 0.000590 |
| 3.248000 | -0.145958 | -0.145310 | 0.000648 |
| 3.480000 | -0.167559 | -0.166860 | 0.000699 |
| 3.712000 | -0.190651 | -0.189910 | 0.000741 |
| 3.944000 | -0.215234 | -0.214463 | 0.000771 |
| 4.176000 | -0.241308 | -0.240522 | 0.000786 |
| 4.408000 | -0.268875 | -0.268091 | 0.000784 |
| 4.640000 | -0.297935 | -0.297173 | 0.000762 |
| 4.872000 | -0.328487 | -0.327772 | 0.000715 |
| 5.104000 | -0.360533 | -0.359891 | 0.000642 |
| 5.336000 | -0.394073 | -0.393535 | 0.000537 |
| 5.568000 | -0.429106 | -0.428708 | 0.000398 |
| 5.800000 | -0.465635 | -0.465414 | 0.000221 |
| 6.032000 | -0.503658 | -0.503658 | 0.000000 |

APPENDIX C

Optical Prescription for Objective Optics depicted in FIG. 4.

Form: PNPP (type B)

| ELT NO. | SUR NO. | SURFACE DESCRIPTION RADIUS X | | THICKNESS OR SEPARATION | APERTURE DESCRIPTION DIMENSION X | | MATERIAL |
|---|---|---|---|---|---|---|---|
| | | | Y | SHAPE | | Y | SHAPE |

```
                    OBJECT          INF          FLT   237.1340
                                                125.5236        160.444      C-1

DECENTER( 1)
           1                              0.0000                181.301      CIR
(STOP)
                          RETURN( 1)

DECENTER( 2)
    1      2    -203.104              A-1 -125.5566   224.000               CIR          REFL 2      3     -31.766              A-2  420.3885    19.500               C-2          REFL

DECENTER( 3)
    3      4    INF                   A-3 -224.8319    11.000   9.200  C-3              REFL
                          RETURN( 3)

DECENTER( 4)
    4      5     35.266               A-4  985.5318     7.400   4.800  C-4              REFL
                          RETURN( 4)

DECENTER( 5)
    IMAGE         INF                 FLT              413.863
                          RETURN( 5)
```

NOTES - Positive radius indicates the center of curvature is to the right
       Negative radius indicates the center of curvature is to the left
     - Dimensions are given in millimeters

- Thickness is axial distance to next surface

- Image diameter shown above is a paraxial value,
       it is not a ray traced value

APERTURE DATA

| APERTURE | SHAPE | | DIAMETER X | Y | DECENTER X | Y | ROTATION |
|---|---|---|---|---|---|---|---|
| C- 1 | CIRCLE | | 160.444 | | | | |
| | CIRCLE | (OBSC) | 22.500 | 22.500 | 0.000 | -3.175 | 0.0 |
| | RECTANGLE | (OBSC) | 21.600 | 60.000 | 0.000 | 30.000 | 0.0 |
| C- 2 | CIRCLE | | 19.500 | 19.500 | 0.000 | -3.175 | 0.0 |
| C- 3 | RECTANGLE | | 11.000 | 9.200 | 0.000 | 0.775 | 0.0 |
| C- 4 | RECTANGLE | | 7.400 | 4.800 | 0.000 | 2.920 | 0.0 |

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

ASPHERIC    CURV         K              A              B              C         D

```
     A- 1    -0.00492359       -0.177909      1.06780E-11    8.01201E-17    0.00000E+00
0.00000E+00

A- 2    -0.03147977       -0.645495      2.53860E-07    0.00000E+00    0.00000E+00
0.00000E+00

A- 3     0.00000000        0.000000     -8.75795E-08    0.00000E+00    0.00000E+00
0.00000E+00

A- 4     0.02835567        0.761823     -9.57017E-06    0.00000E+00    0.00000E+00
0.00000E+00
```

DECENTERING CONSTANTS

| DECENTER | X | Y | Z | ALPHA | BETA | GAMMA |
|---|---|---|---|---|---|---|
| D( 1) (RETU) | 0.0000 | -31.9686 | 0.0000 | 0.0000 | 0.0000 | 0.0000 |
| D( 2) | 0.0000 | 0.2258 | 0.0000 | 0.0085 | 0.0000 | 0.0000 |
| D( 3) (RETU) | 0.0000 | 0.0000 | 0.0000 | 3.6902 | 0.0000 | 0.0000 |
| D( 4) (RETU) | 0.0000 | -29.1446 | 0.0000 | 7.3804 | 0.0000 | 0.0000 |
| D( 5) (RETU) | 0.0000 | -51.4026 | 0.0000 | 7.3773 | 0.0000 | 0.0000 |

A decenter defines a new coordinate system (displaced and/or rotated) in which subsequent surfaces are defined. Surfaces following a decenter are aligned on the local mechanical axis (z-axis) of the new coordinate system. The new mechanical axis remains in use until changed by another decenter. The order in which displacements and tilts are applied on a given surface is specified using different decenter types and these generate different new coordinate systems; those used here are explained below. Alpha, beta, and gamma are in degrees.

DECENTERING CONSTANT KEY:

| TYPE | TRAILING CODE | ORDER OF APPLICATION |
|---|---|---|
| DECENTER | | DISPLACE (X,Y,Z) <br> TILT (ALPHA,BETA,GAMMA) <br> REFRACT AT SURFACE <br> THICKNESS TO NEXT SURFACE |
| DECENTER & RETURN | RETU | DECENTER (X,Y,Z,ALPHA,BETA,GAMMA) <br> REFRACT AT SURFACE <br> RETURN (-GAMMA,-BETA,-ALPHA,-Z,-Y,-X) <br> THICKNESS TO NEXT SURFACE |

REFERENCE WAVELENGTH =       13.5 NM

This is a non-symmetric system. If elements with power are decentered or tilted, the first order properties are probably inadequate in describing the system characteristics.

INFINITE CONJUGATES
  EFL   =    -1.1191
  BFL   =    18.1212
  FFL   =  -237.1402
  F/NO  =    -0.0062

AT USED CONJUGATES

```
REDUCTION     =   179.1972
FINITE F/NO   =   369.4788
OBJECT DIST   =   237.1340
TOTAL TRACK   =  1418.1894
IMAGE DIST    =   985.5318
OAL           =   195.5236
PARAXIAL
  IMAGE HT    =    22.8476
  IMAGE DIST  =  -182.4227
SEMI-FIELD
  ANGLE       =     5.0067
ENTR PUPIL
  DIAMETER    =   181.3005
  DISTANCE    =   125.5236
EXIT PUPIL
  DIAMETER    =     0.5595
  DISTANCE    =    18.1177
```

NOTES - FFL is measured from the first surface
      - BFL is measured from the last surface RelayB_Dec032010.len

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A( 1) | -0.00492359 | -0.177909 | 0.106780E-10 | 0.801201E-16 | 0.000000E+00 | 0.000000E+00 |

CURVATURE OF BEST SPHERE =  -0.004853
RADIUS OF BEST SPHERE    =  -206.058

| Y | ASPH SAG (Z) | SPHERE SAG | SAG DIFFERENCE |
|---|---|---|---|
| 0.000000  |   0.000000 |   0.000000 | 0.000000 |
| 4.480000  |  -0.049414 |  -0.048707 | 0.000707 |
| 8.960000  |  -0.197716 |  -0.194896 | 0.002820 |
| 13.440000 |  -0.445083 |  -0.438775 | 0.006308 |
| 17.920000 |  -0.791815 |  -0.780693 | 0.011121 |
| 22.400000 |  -1.238330 |  -1.221141 | 0.017189 |
| 26.880000 |  -1.785174 |  -1.760755 | 0.024419 |
| 31.360000 |  -2.433019 |  -2.400325 | 0.032695 |
| 35.840000 |  -3.182670 |  -3.140794 | 0.041875 |
| 40.320000 |  -4.035066 |  -3.983273 | 0.051793 |
| 44.800000 |  -4.991294 |  -4.929043 | 0.062251 |
| 49.280000 |  -6.052588 |  -5.979570 | 0.073018 |
| 53.760000 |  -7.220341 |  -7.136511 | 0.083830 |
| 58.240000 |  -8.496116 |  -8.401738 | 0.094379 |
| 62.720000 |  -9.881655 |  -9.777342 | 0.104313 |
| 67.200000 | -11.378892 | -11.265663 | 0.113228 |
| 71.680000 | -12.989969 | -12.869307 | 0.120662 |
| 76.160000 | -14.717253 | -14.591169 | 0.126084 |
| 80.640000 | -16.563355 | -16.434472 | 0.128883 |
| 85.120000 | -18.531152 | -18.402793 | 0.128359 |
| 89.600000 | -20.623816 | -20.500111 | 0.123705 |

| | | | |
|---|---|---|---|
| 94.080000 | -22.844840 | -22.730853 | 0.113988 |
| 98.560000 | -25.198079 | -25.099953 | 0.098126 |
| 103.040000 | -27.687786 | -27.612923 | 0.074863 |
| 107.520000 | -30.318661 | -30.275932 | 0.042729 |
| 112.000000 | -33.095910 | -33.095910 | 0.000000 |

---

RelayB_Dec032010.len

---

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A( 2) | -0.03147977 | -0.645495 | 0.253860E-06 | 0.000000E+00 | 0.000000E+00 | 0.000000E+00 |

CURVATURE OF BEST SPHERE = -0.030591
RADIUS OF BEST SPHERE = -32.689

| Y | ASPH SAG (Z) | SPHERE SAG | SAG DIFFERENCE |
|---|---|---|---|
| 0.000000 | 0.000000 | 0.000000 | -0.019144 |
| 0.512000 | -0.004126 | -0.004010 | -0.019027 |
| 1.024000 | -0.016506 | -0.016042 | -0.018680 |
| 1.536000 | -0.037141 | -0.036107 | -0.018109 |
| 2.048000 | -0.066038 | -0.064217 | -0.017323 |
| 2.560000 | -0.103201 | -0.100395 | -0.016337 |
| 3.072000 | -0.148641 | -0.144666 | -0.015169 |
| 3.584000 | -0.202366 | -0.197065 | -0.013843 |
| 4.096000 | -0.264390 | -0.257631 | -0.012384 |
| 4.608000 | -0.334727 | -0.326409 | -0.010826 |
| 5.120000 | -0.413392 | -0.403452 | -0.009204 |
| 5.632000 | -0.500403 | -0.488819 | -0.007559 |
| 6.144000 | -0.595782 | -0.582576 | -0.005938 |
| 6.656000 | -0.699550 | -0.684798 | -0.004392 |
| 7.168000 | -0.811731 | -0.795566 | -0.002979 |
| 7.680000 | -0.932353 | -0.914969 | -0.001760 |
| 8.192000 | -1.061443 | -1.043105 | -0.000806 |
| 8.704000 | -1.199032 | -1.180080 | -0.000192 |
| 9.216000 | -1.345154 | -1.326011 | 0.000000 |
| 9.728000 | -1.499845 | -1.481022 | -0.000321 |
| 10.240000 | -1.663142 | -1.645250 | -0.001253 |
| 10.752000 | -1.835085 | -1.818843 | -0.002901 |
| 11.264000 | -2.015718 | -2.001958 | -0.005384 |
| 11.776000 | -2.205086 | -2.194767 | -0.008825 |
| 12.288000 | -2.403238 | -2.397456 | -0.013362 |
| 12.800000 | -2.610224 | -2.610224 | -0.019144 |

---

RelayB_Dec032010.len

---

ASPHERIC CONSTANTS $$Z = \frac{(CURV)Y^2}{\cdots} + (A)Y^4 + (B)Y^6 + (C)Y^8 + (D)Y^{10}$$

$$1 + (1-(1+K)(CURV)^2 Y^2)^{1/2}$$

| ASPHERIC | CURV | K | A | B | C | D |
|---|---|---|---|---|---|---|
| A( 3) | 0.00000000 | 0.000000 | -0.875795E-07 | 0.000000E+00 | 0.000000E+00 | 0.000000E+00 |

CURVATURE OF BEST SPHERE = -0.000006
RADIUS OF BEST SPHERE = -171184.091

| Y | ASPH SAG (Z) | SPHERE SAG | SAG DIFFERENCE |
|---|---|---|---|
| 0.000000 | 0.000000 | 0.000000 | 0.000024 |
| 0.231000 | 0.000000 | 0.000000 | 0.000024 |
| 0.462000 | 0.000000 | -0.000001 | 0.000024 |
| 0.693000 | 0.000000 | -0.000001 | 0.000023 |
| 0.924000 | 0.000000 | -0.000002 | 0.000022 |
| 1.155000 | 0.000000 | -0.000004 | 0.000021 |
| 1.386000 | 0.000000 | -0.000006 | 0.000019 |
| 1.617000 | -0.000001 | -0.000008 | 0.000017 |
| 1.848000 | -0.000001 | -0.000010 | 0.000015 |
| 2.079000 | -0.000002 | -0.000013 | 0.000013 |
| 2.310000 | -0.000002 | -0.000016 | 0.000011 |
| 2.541000 | -0.000004 | -0.000019 | 0.000009 |
| 2.772000 | -0.000005 | -0.000022 | 0.000007 |
| 3.003000 | -0.000007 | -0.000026 | 0.000005 |
| 3.234000 | -0.000010 | -0.000031 | 0.000003 |
| 3.465000 | -0.000013 | -0.000035 | 0.000002 |
| 3.696000 | -0.000016 | -0.000040 | 0.000001 |
| 3.927000 | -0.000021 | -0.000045 | 0.000000 |
| 4.158000 | -0.000026 | -0.000050 | 0.000000 |
| 4.389000 | -0.000032 | -0.000056 | 0.000001 |
| 4.620000 | -0.000040 | -0.000062 | 0.000002 |
| 4.851000 | -0.000048 | -0.000069 | 0.000004 |
| 5.082000 | -0.000058 | -0.000075 | 0.000007 |
| 5.313000 | -0.000070 | -0.000082 | 0.000012 |
| 5.544000 | -0.000083 | -0.000090 | 0.000017 |
| 5.775000 | -0.000097 | -0.000097 | 0.000024 |

RelayB_Dec032010.len

ASPHERIC CONSTANTS $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC | CURV | K | A | B | C | D |
|---|---|---|---|---|---|---|
| A( 4) | 0.02835567 | 0.761823 | -0.957017E-05 | 0.000000E+00 | 0.000000E+00 | 0.000000E+00 |

CURVATURE OF BEST SPHERE = 0.027759
RADIUS OF BEST SPHERE = 36.024

| Y | ASPH SAG (Z) | SPHERE SAG | SAG DIFFERENCE |
|---|---|---|---|

| | | | |
|---|---|---|---|
| 0.000000 | 0.000000 | 0.000000 | 0.000000 |
| 0.249000 | 0.000879 | 0.000861 | −0.000018 |
| 0.498000 | 0.003516 | 0.003442 | −0.000073 |
| 0.747000 | 0.007910 | 0.007746 | −0.000164 |
| 0.996000 | 0.014060 | 0.013772 | −0.000289 |
| 1.245000 | 0.021965 | 0.021520 | −0.000445 |
| 1.494000 | 0.031623 | 0.030993 | −0.000629 |
| 1.743000 | 0.043031 | 0.042192 | −0.000839 |
| 1.992000 | 0.056187 | 0.055118 | −0.001069 |
| 2.241000 | 0.071088 | 0.069773 | −0.001315 |
| 2.490000 | 0.087730 | 0.086159 | −0.001571 |
| 2.739000 | 0.106109 | 0.104278 | −0.001831 |
| 2.988000 | 0.126222 | 0.124134 | −0.002087 |
| 3.237000 | 0.148062 | 0.145729 | −0.002333 |
| 3.486000 | 0.171626 | 0.169066 | −0.002560 |
| 3.735000 | 0.196908 | 0.194149 | −0.002760 |
| 3.984000 | 0.223903 | 0.220981 | −0.002922 |
| 4.233000 | 0.252603 | 0.249566 | −0.003037 |
| 4.482000 | 0.283003 | 0.279908 | −0.003094 |
| 4.731000 | 0.315095 | 0.312013 | −0.003083 |
| 4.980000 | 0.348873 | 0.345884 | −0.002990 |
| 5.229000 | 0.384330 | 0.381526 | −0.002804 |
| 5.478000 | 0.421458 | 0.418946 | −0.002511 |
| 5.727000 | 0.460248 | 0.458148 | −0.002099 |
| 5.976000 | 0.500692 | 0.499139 | −0.001553 |
| 6.225000 | 0.542783 | 0.541925 | −0.000858 |
| 6.474000 | 0.586512 | 0.586512 | 0.000000 |

What is claimed is:

1. An apparatus for inspecting a photomask using extreme ultra-violet (EUV) light, the apparatus comprising:
   an illumination source for generating the EUV light which illuminates a target substrate;
   objective optics for receiving and projecting the EUV light which is reflected from the target substrate; and
   a sensor for detecting the EUV light which is projected by the objective optics,
   wherein the objective optics comprises
      a first mirror which is arranged to receive and reflect the EUV light which is reflected from the target substrate,
      an opening in the first mirror,
      a second mirror which is arranged to receive and reflect the EUV light which is reflected by the first mirror,
      a third mirror which is arranged to receive and reflect the EUV light which is reflected by the second mirror, wherein the light reflected by the second mirror passes through the opening in the first mirror in traveling to the third mirror, and
      a fourth mirror which is arranged to receive and reflect the EUV light which is reflected by the third mirror.

2. The apparatus of claim 1, wherein the second mirror partially obscures the first mirror from the EUV light reflected from the target substrate.

3. The apparatus of claim 1, wherein the first, second, third, and fourth mirrors are, respectively, concave, concave, convex and concave.

4. The apparatus of claim 1, wherein the first, second, third, and fourth mirrors are, respectively, concave, convex, concave and convex.

5. The apparatus of claim 1, wherein the first, second, third, and fourth mirrors are, respectively, concave, convex, concave, and concave.

6. The apparatus of claim 1, wherein the numerical aperture of the objective optics is greater than 0.2.

7. The apparatus of claim 1, wherein a field of view of the apparatus is at least greater than 5,000 square microns.

8. The apparatus of claim 1, wherein a distance between the target substrate and the second mirror is greater than 100 millimeters.

9. Objective optics for extreme ultra-violet light formed by an arrangement of mirrors, the objective optics comprising:
   a first mirror which is arranged to receive and reflect the EUV light which is reflected from the target substrate;
   an opening in the first mirror;
   a second mirror which is arranged to receive and reflect the EUV light which is reflected by the first mirror;
   a third mirror which is arranged to receive and reflect the EUV light which is reflected by the second mirror, wherein the EUV light reflected by the second mirror passes through the opening in the first mirror before the EUV light is received by the third mirror; and
   a fourth mirror which is arranged to receive and reflect the EUV light which is reflected by the third mirror,
   wherein the numerical aperture of the objective optics is greater than 0.2.

10. The objective optics of claim 9, wherein the second mirror partially obscures the first mirror from the EUV light reflected from the target substrate.

11. The objective optics of claim 9, wherein the first, second, third, and fourth mirrors are, respectively, concave, concave, convex and concave.

12. The objective optics of claim 9, wherein the first, second, third, and fourth mirrors are, respectively, concave, convex, concave and convex.

13. The objective optics of claim 9, wherein the first, second, third, and fourth mirrors are, respectively, concave, convex, concave, and concave.

14. The objective optics of claim 9, wherein a field of view of the apparatus is at least greater than 5,000 square microns.

15. The objective optics of claim 9, wherein a distance between the target substrate and the second mirror is greater than 100 millimeters.

16. A method of projecting extreme-ultraviolet light reflected from a manufactured substrate to a sensor, the method comprising:
   receiving and reflecting the EUV light which is reflected from the manufactured substrate by a first mirror;
   receiving and reflecting the EUV light which is reflected from the first mirror by a second mirror;
   passing the EUV light reflected from the second mirror through an opening in the first mirror;
   receiving and reflecting the EUV light which passed through the opening in the first mirror by a third mirror;
   receiving and reflecting the EUV light which is reflected from the third mirror by a fourth mirror; and
   detecting the EUV light which is reflected by the fourth mirror.

17. The method of claim 16, wherein the numerical aperture of the objective optics is greater than 0.2.

18. The method of claim 16, wherein the second mirror partially obscures the first mirror from the EUV light reflected from the manufactured substrate.

* * * * *